(12) United States Patent
Oberdorfer

(10) Patent No.: US 7,554,464 B1
(45) Date of Patent: Jun. 30, 2009

US007554464B1

(54) METHOD AND SYSTEM FOR PROCESSING DATA HAVING A PATTERN OF REPEATING BITS

(75) Inventor: Matthias Oberdorfer, Menlo Park, CA (US)

(73) Assignee: Gear Six, Inc., Menlo Park, CA (US)

( * ) Notice: Subject to any disclaimer, the term of this patent is extended or adjusted under 35 U.S.C. 154(b) by 821 days.

(21) Appl. No.: 10/956,377

(22) Filed: Sep. 30, 2004

(51) Int. Cl.
    *H03M 5/00* (2006.01)

(52) U.S. Cl. .......................................... 341/55; 712/221

(58) Field of Classification Search ............. 341/50–90; 382/145, 166, 306, 233, 241; 370/316; 712/240, 712/4, 10, 11, 14, 22, 27, 28, 221, 225, 138; 345/419, 423, 427
    See application file for complete search history.

(56) References Cited

U.S. PATENT DOCUMENTS

| | | | | |
|---|---|---|---|---|
| 5,001,764 A | * | 3/1991 | Wood et al. ................. 382/145 |
| 5,168,524 A | * | 12/1992 | Kroeker et al. .............. 704/254 |
| 5,568,550 A | * | 10/1996 | Ur ............................ 382/306 |
| 5,841,683 A | * | 11/1998 | Bechade et al. ............. 708/497 |
| 6,072,871 A | * | 6/2000 | Ur ............................. 380/51 |
| 6,185,509 B1 | * | 2/2001 | Wilstrup et al. ............... 702/69 |
| 6,334,138 B1 | * | 12/2001 | Kureya ....................... 709/201 |
| 6,449,570 B1 | * | 9/2002 | Wilstrup et al. ............... 702/69 |
| 6,525,722 B1 | * | 2/2003 | Deering ..................... 345/419 |
| 6,898,311 B2 | * | 5/2005 | Whitehead .................. 382/166 |
| 6,986,027 B2 | * | 1/2006 | Barowski et al. ............ 712/240 |
| 7,275,148 B2 | * | 9/2007 | Moyer et al. ................ 712/225 |
| 7,315,932 B2 | * | 1/2008 | Moyer .......................... 712/4 |
| 7,388,937 B1 | * | 6/2008 | Rodger et al. ............... 375/348 |
| 7,409,535 B2 | * | 8/2008 | Park et al. ................... 712/240 |
| 7,453,379 B2 | * | 11/2008 | Plamondon .................. 341/87 |
| 7,460,038 B2 | * | 12/2008 | Samuels et al. ............... 341/87 |

* cited by examiner

*Primary Examiner*—Lam T Mai
(74) *Attorney, Agent, or Firm*—Pillsbury Winthrop Shaw Pittman LLP

(57) ABSTRACT

A method and system allows for fast compression and decompressing of data using existing repetitive interleaved patterns within scientific data (floating point, integer, and image). An advantage of the method and system is that it is so fast that it can be used to save time due to a lower amount of data transferred/stored in scenarios like network transfer, disk or memory storage, cache storage or any other real-time applications where time plays a crucial role.

30 Claims, 7 Drawing Sheets

4 | a1 | 4 | e2 | 4 | 26, 23, 26,12 = 9 bytes

4 | fe | 4 | e2 | 4 | 26, 23, 26, 23 | 4| a4, 12, a4, 12= 14 bytes

FIG. 1A
PRIOR ART

| 00 | 00 | 01 | 00 | 00 | 00 | 01 | 01 | 00 | 00 | 01 | 02 | 00 | 00 | 01 | 03 |

| fe | e2 | 26 | a4 | fe | e2 | 23 | 12 | fe | e2 | 26 | a4 | fe | e2 | 23 | 12 |

| fe | e2 | 26 | f1 | 4e | e2 | 26 | a4 | fe | e2 | 23 | f1 | 4e | e2 | 23 | 12 |

| a1 | e2 | 26 | e1 | e2 | 23 | a1 | e2 | 26 | a1 | e2 | 12 |

Purple Shade Dark   Purple Shade Normal   Purple Shade Dark   Purple Shade Light

FIG. 3
PRIOR ART

| 00 | 00 | 00 | 00 | 00 | 23 | 00 | 00 | 00 | 00 | 00 | 12 |

4 | a1 | 4 | e2 | 4 | 26, 23, 26, 12 = 9 bytes

4 | fe | 4 | e2 | 4 | 26, 23, 26, 23 | 4| a4, 12, a4, 12= 14 bytes 12 bytes

4 | a1 e2 | 4 | 26, 23, 26,12 = 8 bytes 16 bytes

4 | fe e2 | 2 | 26, 23| 2 | a4, 12 = 9 bytes

METHOD AND SYSTEM FOR PROCESSING DATA HAVING A PATTERN OF REPEATING BITS

FIELD OF THE INVENTION

The present invention relates generally to data compression, and in particular to a method of fast data compression for representations of numbers such as floating point numbers, integer numbers and image data.

BACKGROUND OF THE INVENTION

Generally, data compression involves taking "symbols" from an input "text", processing the symbols, and writing "codes" to a compressed file. Most data compression methods in common use today fall into one of two categories: (1) Dictionary-based schemes; and (2) Statistical methods. Both existing known compression methods have usually two key objectives: (1) reduce to the smallest size, i.e. analyze the source text and compress the data to its smallest possible representation; (2) fast decompression, i.e the method should enable replay, transmission or reading of the data from its compressed form quickly.

Dictionary based compression systems operate by replacing groups of symbols in the input text with fixed length codes. A well-known example of a dictionary technique is LZW data compression. LZW operates by replacing strings of essentially unlimited length with codes that usually range in size from 9 to 16 bits.

Statistical methods of data compression take a completely different approach. They operate by encoding symbols one at a time. The symbols are encoded into variable length output codes. The length of the output code varies based on the probability or frequency of the symbol. Low probability symbols are encoded using many bits, and high probability symbols are encoded using fewer bits.

Both methods spend most of their time investigating the source text and analyzing it to find the patterns that can be represented in another (smaller size) format. For high performance applications this approach does not work. To achieve the goal of highest speed in compression no time can be spent in statistical analysis or directory creation. In order to send data over a network, store it on disk and memory, fast compression is critical because it takes longer to send or store than to compress. This means there is almost no time for analysis of source data and still there needs to be a significant advantage in size.

Accordingly, it would be desirable to save time (not space) due to a lower amount of data transferred/stored, but without the high latency introduced by the conventional techniques. This benefits network transfer, disk or memory storage, cache storage or any other real-time applications where time plays a crucial role.

SUMMARY OF THE INVENTION

The present invention relates to data compression. According to one aspect, a method and system allows for fast compression and decompressing of data using existing repetitive interleaved patterns within scientific data (floating point, integer, and image). An advantage of the invention is that it is so fast that it can be used to save time due to a lower amount of data transferred/stored in scenarios like network transfer, disk or memory storage, cache storage or any other real-time applications where time plays a crucial role.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 1A to 1C illustrate conventional numeric data formats;

FIG. 2 illustrates a conventional image data format;

FIG. 3 illustrates a conventional random data format;

DETAILED DESCRIPTION OF THE PREFERRED EMBODIMENTS

Figure 4:
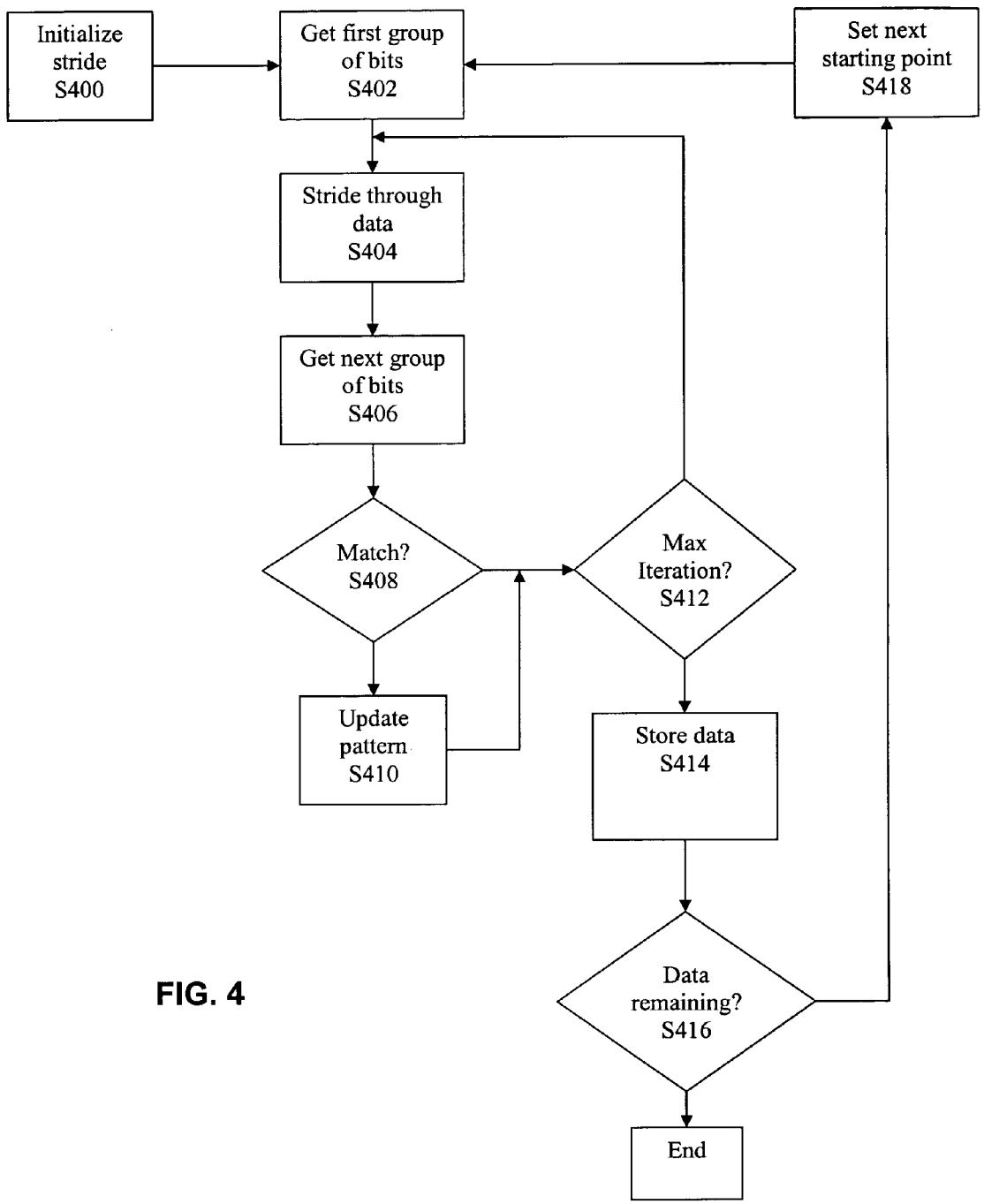
FIG. 4 is a flowchart illustrating a compression method according to one embodiment of the present invention.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not necessarily be limited to other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Generally, the invention introduces a new method and system for fast compression and decompression of data. According to one aspect, the invention allows for performing data compression by exploiting existing repetitive interleaved patterns within standard representations of scientific data, such as in floating point and integer number representations, and image data.

For example, the present invention recognizes that conventional numerical data types such as floating point and integer numbers are typically represented by computers in various accuracies which command different lengths of the representation in bytes. Examples include but are not limited to ANSI defined data type such as ANSI-IEEE 754-1985 for single and double precision. As shown in FIG. 1A, integer numbers can be represented as long integers of four bytes. Specifically, FIG. 1A shows four four-byte integers comprised of 00000100H (256 decimal), 00000101H (257 decimal), 00000102H (258 decimal) and 00000103H (258 decimal) Another possible representation (not shown) is short integers of two bytes, as well as larger integer types of eight and sixteen bytes.

As further shown in FIGS. 1B and 1C, floating point numbers are typically represented by an exponent and mantissa part. FIG. 1B shows a standard "Float" data type comprised of four bytes. Specifically, FIG. 1B shows four floating point numbers comprised of four bytes each, i.e. FEE226A4H (0.1231 decimal), FEE22312H (0.1333 decimal), FEE226A4H (0.1231 decimal) and FEE22312H (0.1333 decimal). Meanwhile FIG. 1C shows a standard "Double" data type comprising eight bytes. Specifically, FIG. 1C shows two double precision floating point numbers of eight bytes each, i.e. FEE226F14EE226A4H (10e-0.1231 decimal) and FEE223F14EE22312H (10e-0.1421 decimal). It should be noted that even further floating point precision may be represented by data comprising sixteen bytes (not shown).

Image pixel data uses a color coding representation of Red, Green and Blue (RGB) or Cyan, Yellow and Magenta (CYM). Typically these image data representations include pixels comprising three bytes (as shown in FIG. 2) or six bytes. Specifically, FIG. 2 shows data for four pixels of three bytes each, i.e. A1E226H (representing purple shade dark in RGB), A1E223H (representing purple shade normal in RGB), A1E226 (representing purple shade dark in RGB) and A1E212 (representing purple shade light in RGB).

With regard to image data in particular, an aspect of the invention makes the following observations regarding image pixel data:

Numbers/pixels of the same representation type occur massively.
   For example, a scientific application using a matrix solver algorithm uses floating point numbers of 4 byte size each to represent the whole matrix. A picture consists usually of the same type/size of pixel representations.
Numbers/pixels are very close in range.
The numbers in the matrix are very close in value, and so the colors of adjacent pixels are also very close.
Parts of the Numbers/Pixel are Repetitive.
   If the range of values is close enough a part of the representation is likely occurring repetitively. For instance, if the exponent is the same for all floating point values, the red part of the picture may stay the same for a large segment in the picture.

FIG. 3 illustrates other random data such as text and other file data that may be included along with scientific data.

An example compression method according to one embodiment of the invention will now be described. In general, the method involves finding existing, interleaved, repetitive sub patterns of data that occur in larger segments of data and represents them in a space saving format. The segment of data can comprise an entire file(s) or memory block of data. Alternatively, the segment can be a portion of a file or memory block of data. The invention encompasses various examples of segments of data to be compressed. The compressed version of the data can be saved in a file(s) or in a block of memory.

As shown in FIG. 4, processing begins with initialization step S400. In this step, the stride by which a segment of data is examined is set. This can be data type dependent. For example, if the data to be compressed is image data, and it is known or determined (in advance or dynamically) that the data is stored in a format such as RGB with three bytes per pixel, then the stride may be set to examining every third byte. There are many ways in which the stride can be set for a given segment of data. The initialization step S400 can further include initializing a block or file for the compressed data, which can further include control information, such as the stride to be used, the size of the groups of bits in a pattern, etc.

Compression of data begins in step S402, where the first group of bits is examined. In data containing bytes, the group of bits can be one byte, two bytes (i.e. a word), or more bytes. The group of bits can also be nibbles (four bits). There are many ways in which the size of each group of bits can be set for a given segment of data, typically in correspondence with the stride. In step S404, the data corresponding to the size of the stride is skipped, and then in step S406, the group of bits at the end of the stride is retrieved. In step S408, it is determined whether the next group of bits matches the first group of bits. If so, the pattern is updated in step S410. For example, if this is the second occurrence of the same group of bits, the count of that group is incremented from one to two. If there was no match in step S408, or after updating the pattern in step S410, processing proceeds to step S412, where it is determined whether to continue striding through the segment of data from the location of the group of bits retrieved in step S406 and for comparing with the group of bits obtained in step S402. There can be several ways to make this determination. For example, the maximum number of strides can be fixed at a certain number, for example four. As another example, if there was no match in step S408, an attempt at compression can be abandoned. Any combination of these criteria can also be used, such as seeking X number of matches within Y number of strides, where X and Y can be fixed or X can be a function of Y or vice versa.

If it was determined to continue, processing returns to step S404 where striding continues from the last point. Otherwise, the data is stored in a compressed version of the original data (step S414). If a pattern was obtained in the previous steps this pattern information is stored. For example, if the same byte was found in four consecutive strides, the number four is stored, along with the byte. If no pattern was obtained, just the original group of bits is stored, perhaps along with an indication (e.g. a flag bit(s)) that no compression was obtained.

After step S414, it is determined in step S416 whether there is additional data remaining in the segment to be compressed. If so, processing proceeds to step S418 where the next starting point in the data to be compressed, as well as the stride, is determined based on the previous processing. Otherwise, processing ends. It should be noted that the starting point can be at a point corresponding to interleaved data within a previously identified pattern. For example, if a pattern of four consecutive matching bytes at a stride of four bytes was identified and just stored in the previous step S414, the starting point would be reset to the byte after the first byte in the pattern, and the stride would be kept at four bytes. Alternatively, if no pattern was found and uncompressed data was just stored in the previous step S414, and if there was no existing or remaining interleaved data, the starting point would just advance to the point after the group of bits corresponding to the stored uncompressed data.

Figure 5A:
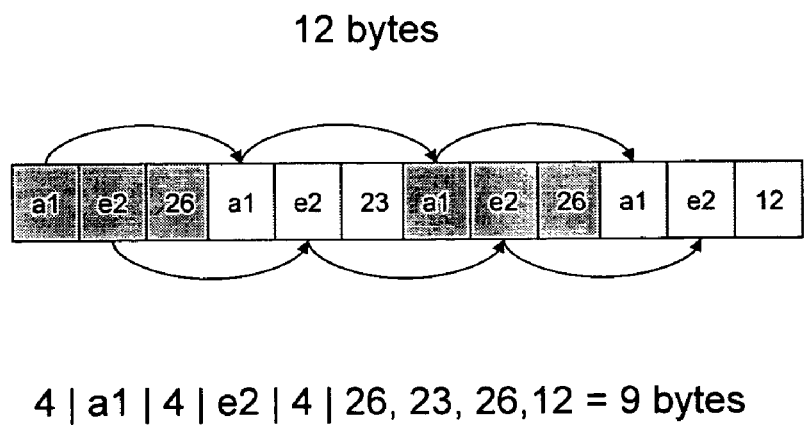
FIGS. 5A and 5B illustrate example applications of the compression method shown in FIG. 4 with image and floating point number data, respectively.

FIG. 5A illustrates one example application of a method in accordance with the embodiment shown in FIG. 4. In this example, a segment of 12 bytes of data is compressed into 9 bytes. The segment may be, for example, four pixels of RGB image data of three bytes per pixel. In this example, the size of the group of bits is a byte, and the stride is three bytes. In this segment, a first pattern of four bytes having the same value of a1 (Hex) at each stride is identified, along with a second pattern of four bytes having the same value of e2 (Hex) at each stride. Accordingly, the segment of data comprising the twelve bytes a1, e2, 26, a1, e2, 23, a1, e2, 26, a1, e2, 12 (Hex) is compressed into nine bytes comprising 4, a1, 4, e2, 4, 26, 23, 26, 12 (Hex).

Figure 5B:
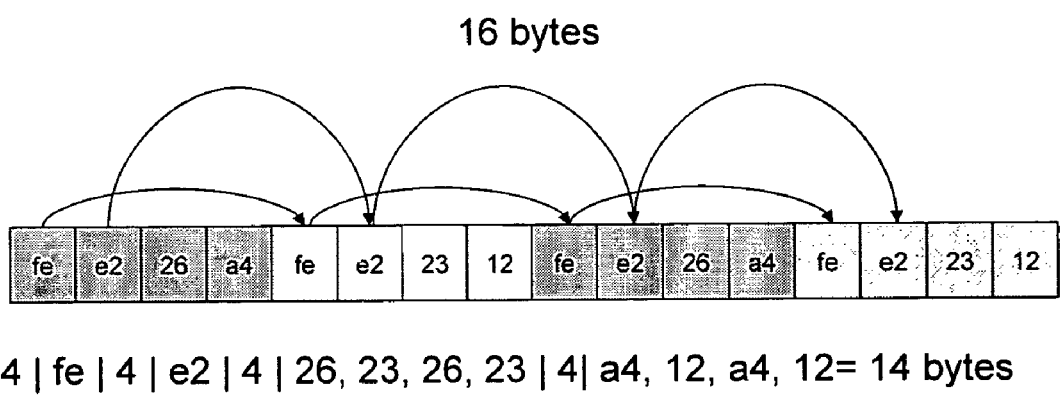

FIG. 5B illustrates another example application of a method in accordance with the embodiment shown in FIG. 4. In this example, a segment of 16 bytes of data is compressed into 14 bytes. The segment may be, for example, four floating point numbers of four bytes per number. In this example, the size of the group of bits is a byte, and the stride is four bytes. In this segment, a first pattern of four bytes having the same value of fe (Hex) at each stride is identified, along with a second pattern of four bytes having the same value of e2 (Hex) at each stride. No pattern is found at the remaining two strides. Accordingly, the segment of data comprising the sixteen bytes fe, e2, 26, a4, fe, e2, 23, 12, fe, e2, 26, a4, fe, e2, 23, 12 (Hex) is compressed into fourteen bytes comprising 4, fe, 4, e2, 4, 26, 23, 26, 23, 4, a4, 12, a4, 12 (Hex).

An example compression method according to another embodiment of the invention will now be described. This alternative embodiment provides for certain compression efficiencies such as variable strides.

Figure 6:
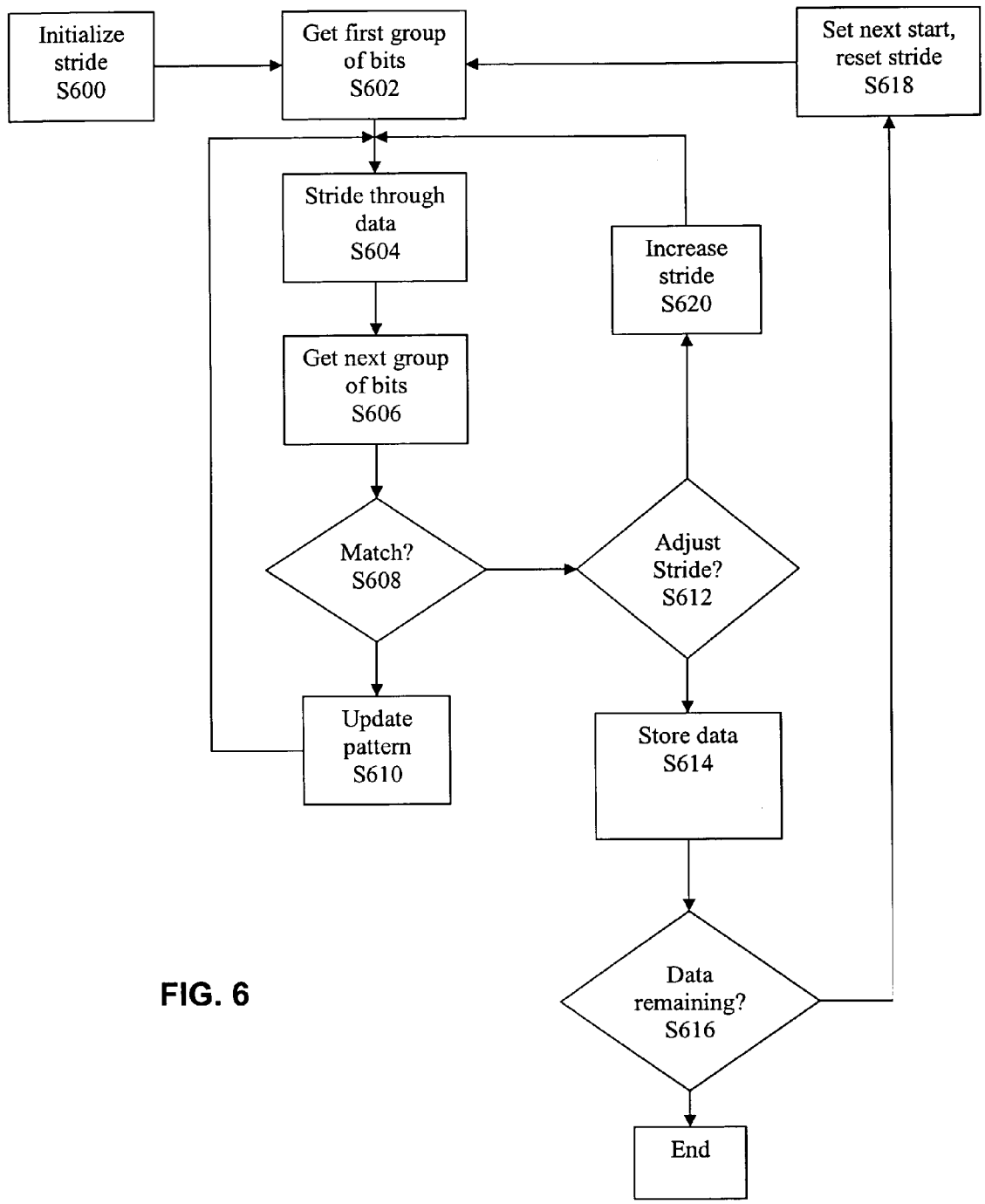
FIG. 6 is a flowchart illustrating a compression method according to another embodiment of the present invention.

As shown in FIG. 6, processing begins with initialization step S600. This processing can be the same as in step S400 described above.

Compression of data begins in step S602, where the first group of bits is examined. In step S604, the data corresponding to the size of the stride is skipped. In step S606, the group of bits at the end of the stride is retrieved. In step S608, it is determined whether the next group of bits matches the first group of bits. If so, the pattern is updated in step S610. For example, if this is the second occurrence of the same group of bits, the count of that group is incremented from one to two. Then processing returns to step S604, where a stride will be made in the data from the point of the last matching group of bits.

If there was no match in step S608, processing proceeds to step S612, where it is determined whether to adjust the stride. For example, if no repeating pattern was found using the current stride from the bits retrieved in the immediately preceding iteration of step S602, in this embodiment, a decision will be made to adjust the stride. In one example, the stride may be doubled every time. However, there may also be a fixed higher limit for the size of the stride, and this highest stride may have just been used in the immediately preceding step S604. In this case, the stride cannot be adjusted. Another possibility considered in step S612 is whether no match was found after one or more successful matches with the current group of bits and current stride. In this case, a decision will be made not to increase the stride for use with the current group of bits. Yet another possibility considered in step S612 is whether a previous pattern was found, and the current search for a match is through interleaved data. In this case, it may not be possible to adjust the stride through the interleaved data.

If a decision is made in step S612 to increase the stride with the current group of bits, processing proceeds to step S620, where the stride is adjusted, and the pointer in the data is reset back to the first group of bits identified in step S602. Processing will then return to step S604 for striding through the data with the adjusted stride.

If a decision is made in step S612 not to increase the stride with the current group of bits, processing proceeds to step S614, where the data is stored in a compressed version of the original data. If a pattern was obtained in the previous steps this pattern information is stored. For example, if the same byte was found in four consecutive strides, the number four is stored, along with the byte. If no pattern was obtained, just the original group of bits is stored, perhaps along with an indication (e.g. a flag bit(s)) that no compression was obtained.

After step S614, it is determined in step S616 whether there is additional data remaining in the segment to be compressed. If so, processing proceeds to step S618 where the next starting point in the data to be compressed, as well as the starting stride value, is determined based on the previous processing. Otherwise, processing ends.

Figure 7A:
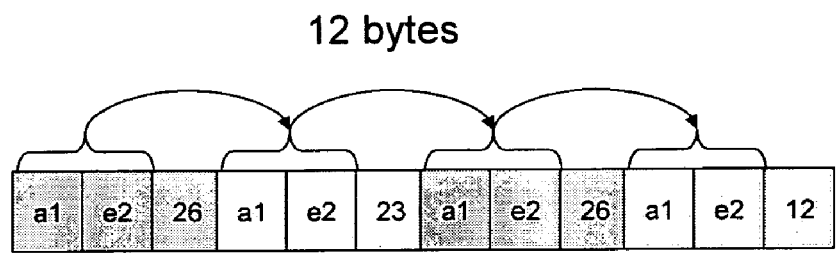
FIGS. 7A and 7B illustrate example applications of the compression method shown in FIG. 6 with image and floating point number data, respectively.

FIG. 7A illustrates one example application of a method in accordance with the embodiment shown in FIG. 6. In this example, a segment of 12 bytes of data is compressed into 8 bytes. The segment may be, for example, four pixels of RGB image data of three bytes per pixel. In this example, the size of the group of bits is a two bytes (i.e. a word), and the stride is three bytes. In this segment, a pattern of four words having the same value of a1 e2 (Hex) at each stride is identified. Accordingly, the segment of data comprising the twelve bytes a1, e2, 26, a1, e2, 23, a1, e2, 26, a1, e2, 12 (Hex) is compressed into eight bytes comprising 4, a1 e2, 26, 23, 26, 12 (Hex).

Figure 7B:
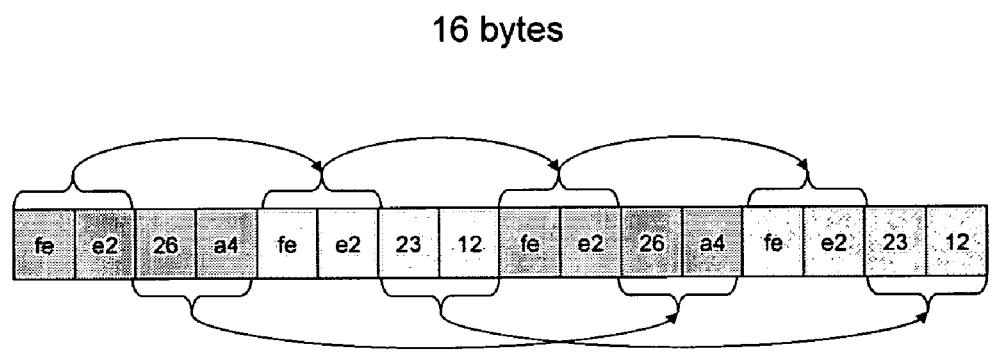

FIG. 7B illustrates another example application of a method in accordance with the embodiment shown in FIG. 6. In this example, a segment of 16 bytes of data is compressed into 9 bytes. The segment may be, for example, four floating point numbers of four bytes per number. In this example, the size of the group of bits is two bytes (i.e. a word), and the first stride is four bytes. In a first pass through this segment, a first pattern of four words having the same value of fe e2 (Hex) at each stride is identified. In a second pass through this segment using a stride of eight bytes, a second pattern of two words having the same value of 26 a4 (Hex) at each stride is identified. In a third pass through this segment using a stride of eight bytes, a third pattern of two words having the same value 23 12 (Hex) at each stride is identified. Accordingly, the segment of data comprising the sixteen bytes fe, e2, 26, a4, fe, e2, 23, 12, fe, e2, 26, a4, fe, e2, 23, 12 (Hex) is compressed into nine bytes comprising 4, fe e2, 2, 26 23, 2, a4 12 (Hex).

Figure 8:
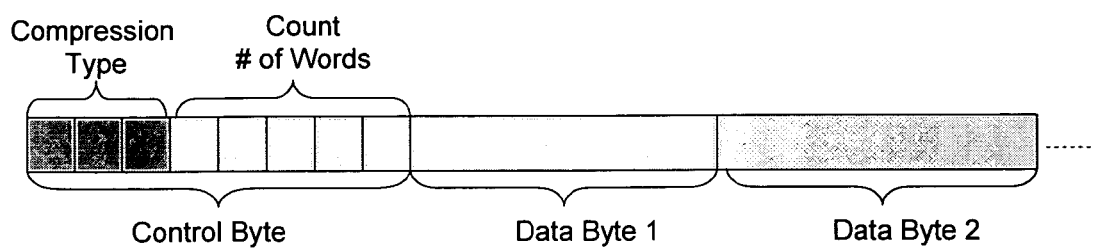
FIG. 8 illustrates a data format for compressed data that can be used in conjunction with the present invention.

FIG. 8 illustrates an example of how data compressed in accordance with the invention can be represented in a stored format.

As shown in FIG. 8, a control byte is used to store information regarding the compression, followed by bytes of compressed data. In this example, the control byte comprises three bits of information regarding the pattern (if any) identified, and five bits of information regarding the length of the pattern. Following is one example of the three-bit codes used to identify the pattern in the subsequent compressed data bytes.

| Compression | Type | Code |
| --- | --- | --- |
| Uncompressed | UNCOMPRESSED | 000 |
| Word size, stride 2 bytes | STRD_1 | 100 |
| Word size, stride 4 bytes | STRD_2 | 101 |
| Word size, stride 6 bytes | STRD_3 | 110 |
| Word size, stride 8 bytes | STRD_4 | 111 |

It should be apparent that other codes could be used to identify patterns having other bit group sizes such as byte size patterns. Moreover, it should be apparent that codes such as described above may not be necessary if the bit group size and the strides were fixed and/or known.

Using the above format with the data compression illustrated in FIG. 7B, the nine byte compressed data would be represented as a4, fe e2, e2, 26 23, e2, a4 12 (Hex).

An example decompression method in accordance with the invention will now be described in connection with FIG. 9.

Figure 9:
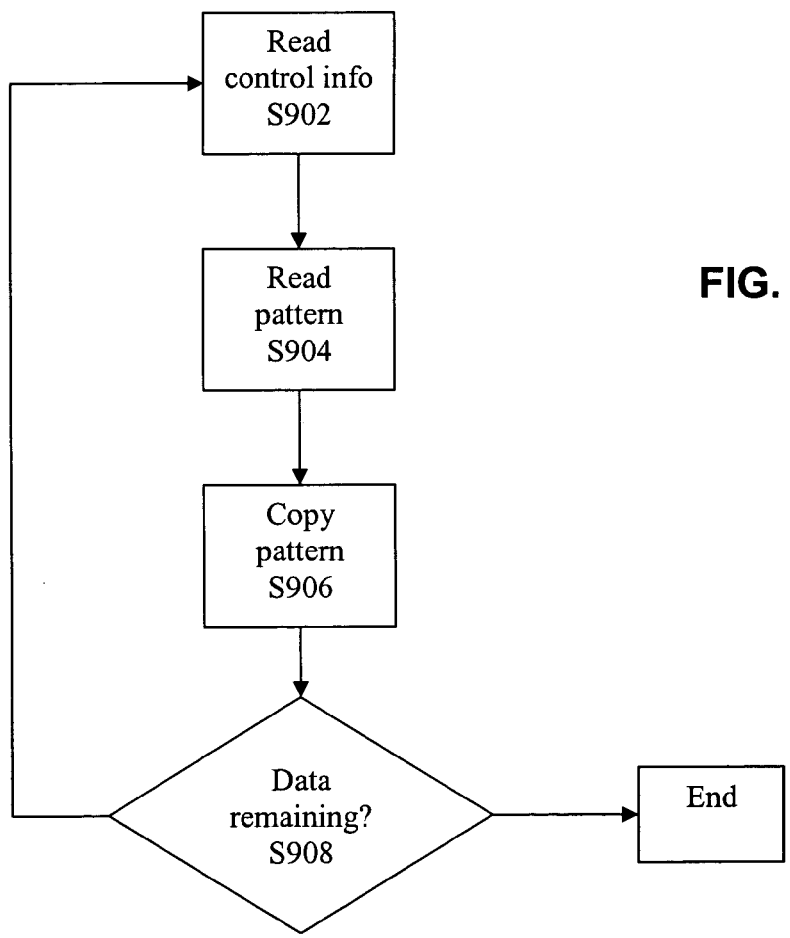
FIG. 9 is a flowchart illustrating a decompression method according to an aspect of the present invention.

As shown in FIG. 9, processing begins by looking at the first control information in the compressed data (S902). For data in the format as described in connection with FIG. 8, this would include retrieving the first control byte, and inspecting the three-bit field containing the compression byte, and the five-bit field containing the count. Using this control information, the corresponding data pattern is retrieved in subsequent data byte(s) (S904). Also using this control information the data pattern is uncompressed and copied into an uncompressed block in step S906. For example, if the control information indicated that a word pattern of a1 e2 was in the next two data bytes, and it is repeated four times at a stride of eight bytes, the next two bytes after the control byte would be read from the compressed data and copied four times into the uncompressed block at the corresponding locations. If there is any compressed data remaining (determined in step S908), processing returns to step S902. Otherwise, processing ends.

Figure 10:
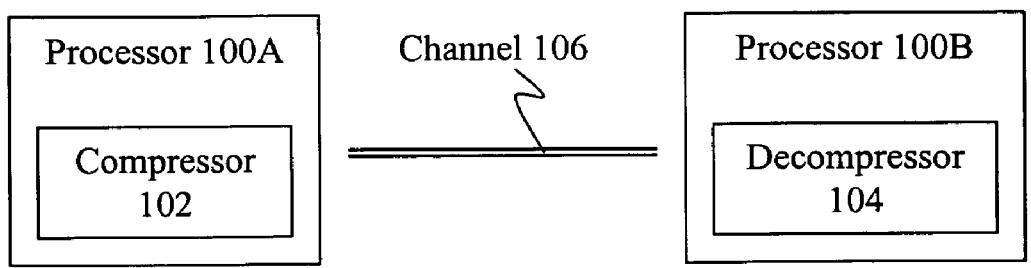
FIG. 10 is a block diagram illustrating an example implementation of the present invention in a high performance computing environment.

FIG. 10 shows an example application of the present invention in a high performance computing environment.

As shown in FIG. 10, a processor 100A includes a compressor 102 that implements a compression function according to the invention such as illustrated in FIGS. 4 and 6. Processor 100B includes a decompressor 104 that implements a decompression function according to the invention such as illustrated in FIG. 9. Processors 100A and 100B can be implemented by computer software, hardware, servers, microprocessors, ASICs, handheld or mobile units, etc. Processors 100A and 100B may also include decompressors and compressors, respectively. Compressor 102 and decompressor 104 may be implemented as microprocessors, ASICs, software, or any combination thereof. It should be apparent that processors 100A and 100B include or interact with communications means that are appropriate for the given channel such as network interface cards for an Ethernet channel, a serial interface for a serial channel, etc.

As further shown in FIG. 10, processors 100A and 100B communicate with each other over a channel 106. The channel can be wired or wireless, or any type of bus or other communications channel. The time for a message of a given size to be exchanged between 100A and 100B can be characterized by the equation:

$$\text{Time} = \text{Latency} + \text{Bandwidth} * \text{size}$$

Latency includes the overhead time to prepare a message for sending by processor 100A (including the compression by compressor 102), execute the send operation by processor 100A, execute the receive operation by processor 100B, and make the message available to applications by processor 100B (including the decompression by decompressor 104). Bandwidth is the number of bytes transmitted per second.

The present invention as applied in a system such as that shown in FIG. 10 greatly improves the overall throughput of information for a given bandwidth because the compression and decompression methods according to the invention greatly reduce the latency versus other forms of compression.

Although the present invention has been particularly described with reference to the preferred embodiments thereof, it should be readily apparent to those of ordinary skill in the art that changes and modifications in the form and details may be made without departing from the spirit and scope of the invention. Certain aspects of one embodiment may also be interchanged with the other embodiments. It is intended that the appended claims encompass such changes, modifications and interchanges.

What is claimed is:

1. A method of processing data, comprising:
    identifying a repeating pattern of bits that occurs a plurality of times within the data;
    identifying a given stride of non-contiguous bits at which the identified repeating pattern repeats the plurality of times within the data; and
    using the identified repeating pattern and given stride to process the data.

2. A method according to claim 1, wherein the using step includes:
    replacing the repeating pattern of bits with one or more bits of information corresponding to the repeating pattern.

3. A method according to claim 2, wherein the information comprises fewer bits than the repeating pattern.

4. A method according to claim 1, further comprising:
    completing the step of identifying the repeating pattern of bits in one pass through the data.

5. A method according to claim 2, further comprising:
    completing the step of identifying the repeating pattern of bits in one pass through the data; and
    preparing a compressed version of the data.

6. A method according to claim 5, further comprising:
    receiving the compressed version of the data; and
    decompressing the compressed version to obtain the data using the information.

7. A method according to claim 1, further comprising:
    identifying another pattern of bits that occurs more than once at another stride of non-contiguous bits within the data.

8. A method according to claim 7, wherein the another pattern of bits is within the given stride of the repeating pattern of bits.

9. A method according to claim 1, wherein the data is scientific data.

10. A method according to claim 1, wherein the data is floating point data.

11. A method according to claim 1, wherein the data is pixel data.

12. An apparatus for processing data, comprising:
    means for identifying a repeating pattern of bits that occurs a plurality of times within the data;
    means for identifying a given stride of non-contiguous bits at which the identified repeating pattern repeats the plurality of times within the data; and
    means for using the identified repeating pattern and given stride to process the data.

13. An apparatus according to claim 12, wherein the means for using includes:
    means for replacing the repeating pattern of bits with one or more bits of information corresponding to the repeating pattern.

14. An apparatus according to claim 13, wherein the information comprises fewer bits than the repeating pattern.

15. An apparatus according to claim 12, wherein the identifying means is operative to complete identifying the repeating pattern of bits in one pass through the data.

16. An apparatus according to claim 13, further comprising:
    means for preparing a compressed version of the data.

17. An apparatus according to claim 16, further comprising:
    means for receiving the compressed version of the data; and
    means for decompressing the compressed version to obtain the data using the information.

18. An apparatus according to claim 12, further comprising:
means for identifying another pattern of bits that occurs more than once at another stride of non-contiguous bits within the data.

19. An apparatus according to claim 18, wherein the another pattern of bits is within the given stride of the repeating pattern of bits.

20. A system comprising:
a first processor that communicates data with a second processor over a channel, the first processor comprising:
a compressor that identifies a pattern of bits that occurs more than once at a given stride of non-contiguous bits within the data, and prepares a compressed version of the data for sending over the channel, the compressed version of the data including information about the pattern.

21. A system according to claim 20, wherein the second processor comprises:
a decompressor that is operative to retrieve the data from the compressed version of the data using the information.

22. A system according to claim 20, wherein the information comprises fewer bits than the identified pattern.

23. A method of processing data, comprising:
identifying a repeating pattern of bits that occurs more than once at a given stride of non-contiguous bits within the data; and
replacing the repeating pattern of bits with one or more bits of information corresponding to the repeating pattern,
wherein the bits of information comprises fewer bits than the repeating pattern.

24. A method of processing data, comprising:
identifying a repeating pattern of bits that occurs more than once at a given stride of non-contiguous bits within the data;
replacing the repeating pattern of bits with one or more bits of information corresponding to the repeating pattern;
completing the step of identifying the repeating pattern of bits in one pass through the data; and
preparing a compressed version of the data.

25. A method according to claim 24, further comprising:
receiving the compressed version of the data; and
decompressing the compressed version to obtain the data using the information.

26. An apparatus processing data, comprising:
means for identifying a repeating pattern of bits that occurs more than once at a given stride of non-contiguous bits within the data; and
means for replacing the repeating pattern of bits with one or more bits of information corresponding to the repeating pattern,
wherein the information comprises fewer bits than the repeating pattern.

27. An apparatus for processing data, comprising:
means for identifying a repeating pattern of bits that occurs more than once at a given stride of non-contiguous bits within the data;
means for replacing the repeating pattern of bits with one or more bits of information corresponding to the repeating pattern; and
means for preparing a compressed version of the data.

28. An apparatus according to claim 27, further comprising:
means for receiving the compressed version of the data; and
means for decompressing the compressed version to obtain the data using the information.

29. An apparatus for processing data, comprising:
means for identifying a repeating pattern of bits that occurs more than once at a given stride of non-contiguous bits within the data;
means for replacing the repeating pattern of bits with one or more bits of information corresponding to the repeating pattern; and
means for identifying another pattern of bits that occurs more than once at a another stride of non-contiguous bits within the data.

30. A system comprising:
a first processor that communicates data with a second processor over a channel, the first processor comprising:
a compressor that identifies a pattern of bits that occurs more than once at a given stride of non-contiguous bits within the data, and prepares a compressed version of the data for sending over the channel, the compressed version of the data including information about the pattern, and
wherein the second processor comprises:
a decompressor that is operative to retrieve the data from the compressed version of the data using the information.

* * * * *